US 8,120,112 B1

(12) United States Patent
Watt et al.

(10) Patent No.: US 8,120,112 B1
(45) Date of Patent: Feb. 21, 2012

(54) METHOD AND APPARATUS FOR IMPROVING TRIGGERING UNIFORMITY OF SNAPBACK ELECTROSTATIC DISCHARGE PROTECTION DEVICES

(75) Inventors: Jeffrey T. Watt, Palo Alto, CA (US); Antonio Gallerano, San Jose, CA (US)

(73) Assignee: Altera Corporation, San Jose, CA (US)

( * ) Notice: Subject to any disclaimer, the term of this patent is extended or adjusted under 35 U.S.C. 154(b) by 967 days.

(21) Appl. No.: 11/904,706

(22) Filed: Sep. 28, 2007

(51) Int. Cl.
*H01L 23/58* (2006.01)

(52) U.S. Cl. ............ 257/355; 257/65; 257/141; 257/213

(58) Field of Classification Search .................. 257/213, 257/355, E29.242, 65, 141
See application file for complete search history.

(56) References Cited

U.S. PATENT DOCUMENTS 7,166,876 B2 * 1/2007 Huang ........................... 257/213

\* cited by examiner

*Primary Examiner* — Cuong Q Nguyen
*Assistant Examiner* — Tran Tran
(74) *Attorney, Agent, or Firm* — L. Cho

(57) ABSTRACT

An electrostatic discharge (ESD) protection circuit includes a first array of transistors, having source and drain doped with a first type of material, arranged in parallel in a first block, and a second array of transistors, having source and drain doped with the first type of material, arranged in parallel in a second block. The ESD protection circuit also includes an active region between the first and second array of transistors doped with a second type of material that is complementary to the first type of material.

18 Claims, 10 Drawing Sheets

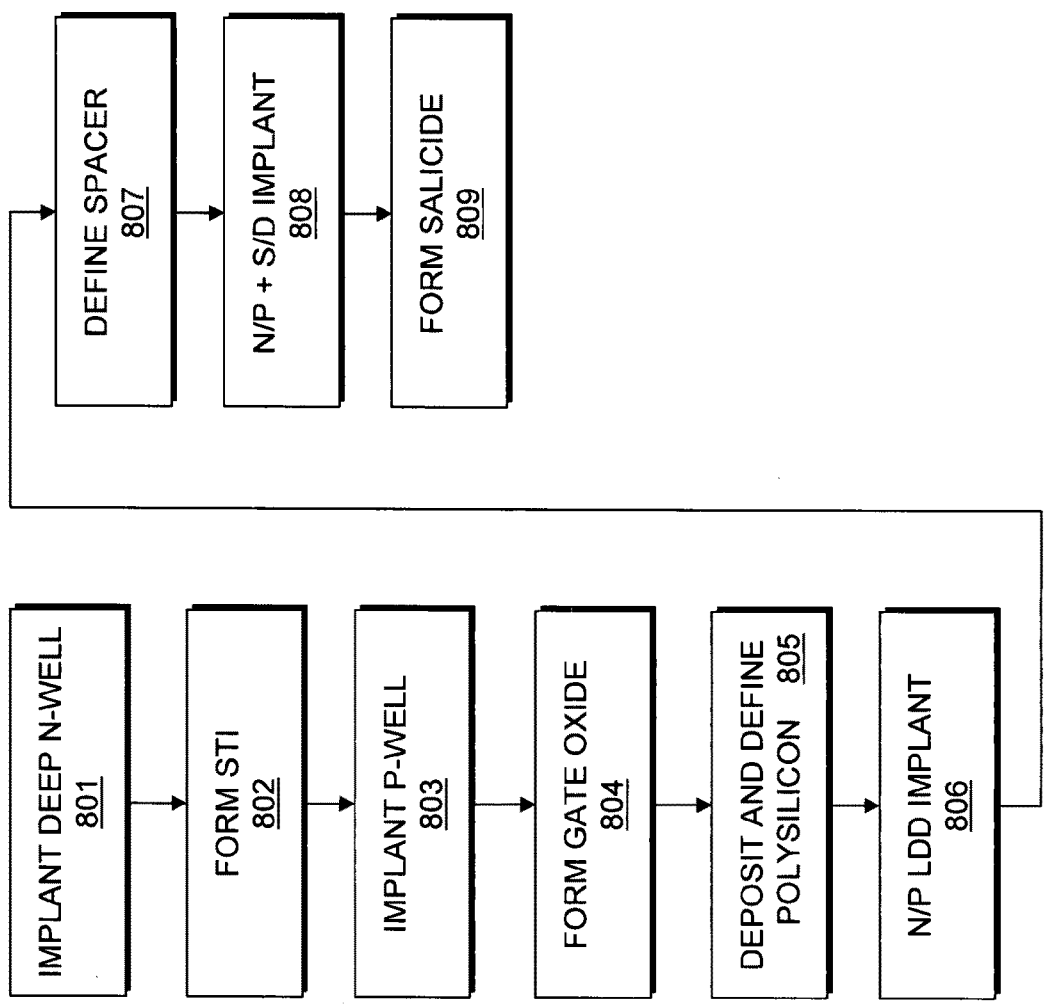

Deep N-Well Implant & STI Definition

P-Well Implant

Gate Oxide Formation, Poly Deposition and Definition

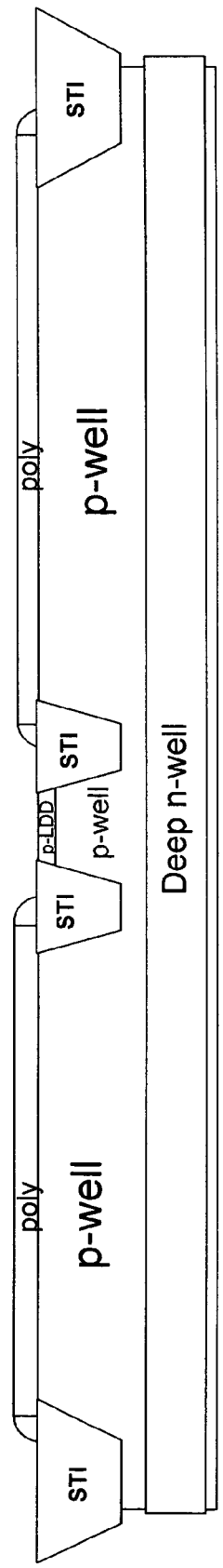
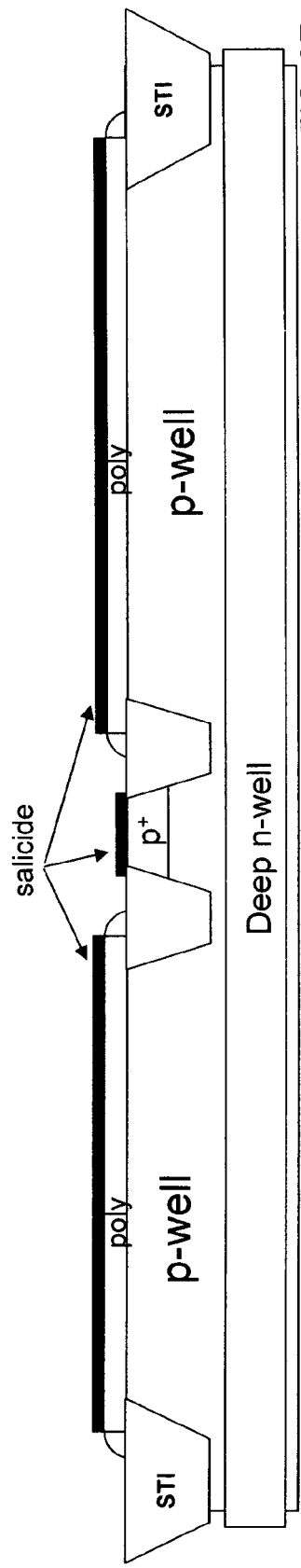
FIG. 9D  N/P-LDD Implant & Spacer Definition (n-LDD not visible in this section)
FIG. 9E  N/P+ S/D Implant & Salicidation (n+ not visible in this section)

METHOD AND APPARATUS FOR IMPROVING TRIGGERING UNIFORMITY OF SNAPBACK ELECTROSTATIC DISCHARGE PROTECTION DEVICES

TECHNICAL FIELD

Embodiments of the present invention relate to electrostatic discharge (ESD) protection devices. More specifically, embodiments of the present invention relate to a method and apparatus for improving triggering uniformity of snapback electrostatic discharge protection devices.

BACKGROUND

ESD is the transfer of electrostatic charge between two objects. It is a rapid event that usually results when two objects of different potentials come into contact with each other. ESD may also occur when a high electrostatic field develops between two objects in close proximity. ESD has been known to cause device failures in the semiconductor industry.

There are several industry-standard ESD models that define how semiconductor devices are tested for ESD sensitivity under different situations of electrostatic build-up and discharge. For example, the human body model (HBM) simulates the ESD phenomenon where a charged body directly transfers its accumulated electrostatic charge to an ESD-sensitive device. The machine module (MM) simulates a more rapid and severe electrostatic discharge from a charged machine, fixture, or tool to the ESD-sensitive device at a lower potential. The charged device model (CDM) simulates a transfer of accumulated electrostatic charge from a charged device to another body of lower potential.

Traditional ESD protection devices for power supplies included transistor snapback based circuits. Transistor snapback based circuits make use of the snap back triggering characteristics of parasitic bipolar structure to switch from some critical level of drain-source breakdown into high-conductivity due to avalanche injection. When snapback based circuits were implemented in input/output (I/O) buffers, it was found that they sustained up to approximately 4 KV HBM when configured with a total width of approximately 350 μm.

SUMMARY

According to an embodiment of the present invention, a method and apparatus for improving triggering uniformity of snapback ESD devices is disclosed. An active region between a first and second array of transistors used to implement the ESD protection circuit is created. The active region effectively forms a low resistive region between the arrays of transistors which operates to equalize the voltage (potential) under the arrays of transistors. According to an embodiment of the present invention, the active region includes dopants used to implant the source and drain of the transistors. The active region may also include a layer of salicide.

BRIEF DESCRIPTION OF THE DRAWINGS

The features and advantages of the present invention are illustrated by way of example and are by no means intended to limit the scope of the present invention to the particular embodiments shown.

FIG. 8 is a flow chart illustrating a method for fabricating a metal oxide semiconductor transistor according to an embodiment of the present invention.

FIGS. 9a-9e illustrate a cross section perspective of how a metal oxide semiconductor transistor is formed according to an embodiment of the present invention.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
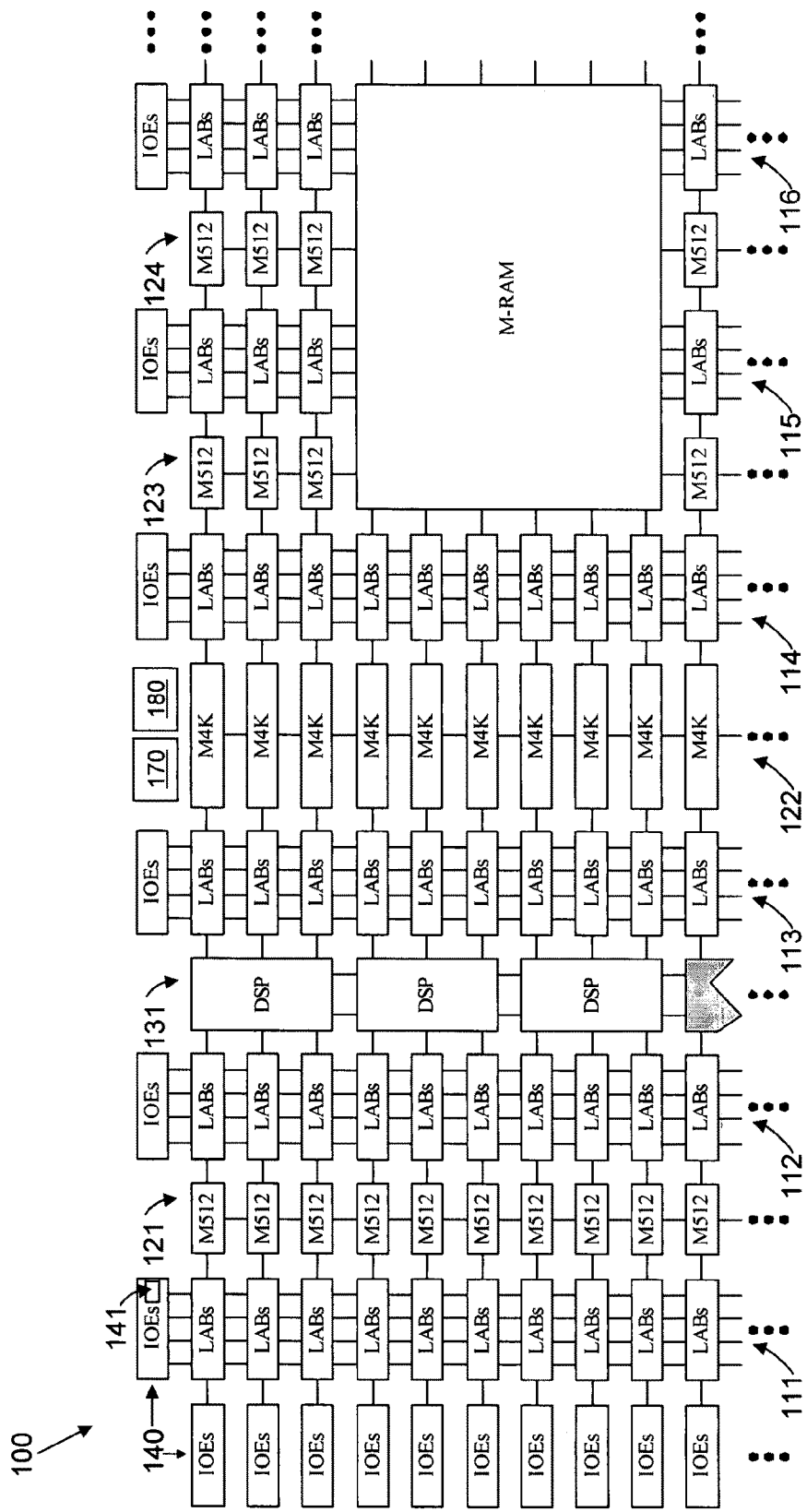
FIG. 1 illustrates a device on which an electrostatic discharge (ESD) protection circuit resides on according to an exemplary embodiment of the present invention.

FIG. 1 illustrates a device 100 on which an electrostatic discharge (ESD) protection circuit resides according to an exemplary embodiment of the present invention. In this example, the device 100 is a target device such as an FPGA which a system may be implemented on. The target device 100 may be a chip having a hierarchical structure that may take advantage of wiring locality properties of circuits formed therein.

The target device 100 includes a plurality of logic-array blocks (LABs). Each LAB may be formed from a plurality of logic blocks, carry chains, LAB control signals, (lookup table) LUT chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in the Stratix™ series or Cyclone™ series manufactured by Altera® Corporation, or a combinational logic block (CLB) such as those found in Virtex™ manufactured by Xilinx® Inc. In this embodiment, the logic block may include a four input lookup table (LUT) with a configurable register. According to an alternate embodiment of the present invention, the logic block may operate similarly to an adaptive logic module (ALM), such as those found in Stratix™ manufactured by Altera® Corporation. LABs are grouped into rows and columns across the target device 100. Columns of LABs are shown as 111-

116. It should be appreciated that the logic block may include additional or alternate components.

The target device 100 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 100. Columns of memory blocks are shown as 121-124.

The target device 100 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 100 and are shown as 131.

The target device 100 includes a plurality of input/output elements (IOEs) 140. Each IOE feeds an I/O pin (not shown) on the target device 100. The IOEs 140 are located at the end of LAB rows and columns around the periphery of the target device 100. Each IOE includes a bidirectional I/O buffer (such as the one illustrated as 141) and a plurality of registers for registering input, output, and output-enable signals. When used with dedicated clocks, the registers provide performance and interface support with external memory devices.

The target device 100 includes a plurality of inputs for connecting an external power supply to the target device 100. One of such inputs is shown at 170.

The target device 100 may be implemented with one or more electrostatic discharge protection circuits to protect components on the target device 100 from ESD events. For example, each of the IOEs 140 may include an I/O buffer (such as the one illustrated as 141), designed to be self protecting during an ESD event. Also, each input used for connecting an external power supply to the target device 100 may have a corresponding ESD protection circuit such as the one shown as 180. The ESD protection circuit 180 may operate to protect a voltage supply line on the target device 100 that corresponds to the input from an ESD event. For example, if an object of higher potential comes in contact with the target device 100 resulting in a voltage spike being present on the voltage supply line, the ESD protection circuit 180 may operate to provide a path to ground to prevent the voltage spike from damaging circuitry on the target device. FIG. 1 illustrates a single input 170 with a single ESD protection circuit 180. It should be appreciated that additional inputs and ESD protection circuits may reside on the target device 100.

The target device 100 may include routing resources such as LAB local interconnect lines, row interconnect lines ("H-type wires"), and column interconnect lines ("V-type wires") (not shown) to route signals between components on the target device.

FIG. 1 illustrates an exemplary embodiment of a target device. It should also be appreciated that the target device may include programmable logic devices arranged in a manner different than that illustrated in FIG. 1. The target device 100 may also include FPGA resources other than those described and illustrated with reference to the target device illustrated in FIG. 1. Thus, while embodiments of the invention described herein may be utilized on the architecture described in FIG. 1, it should be appreciated that it may also be utilized on different architectures, such as those employed by Altera® Corporation in its APEX™, Stratix™, Cyclone™, Stratix™ II, Stratix™ III, Cyclone™ II, Cyclone™ III families of chips and those employed by Xilinx® Inc. in its Virtex™, Virtex™ II, Virtex™ II-PRO, Virtex IV™, Virtex V™, and Spartan-3 line of chips.

Figure 2:
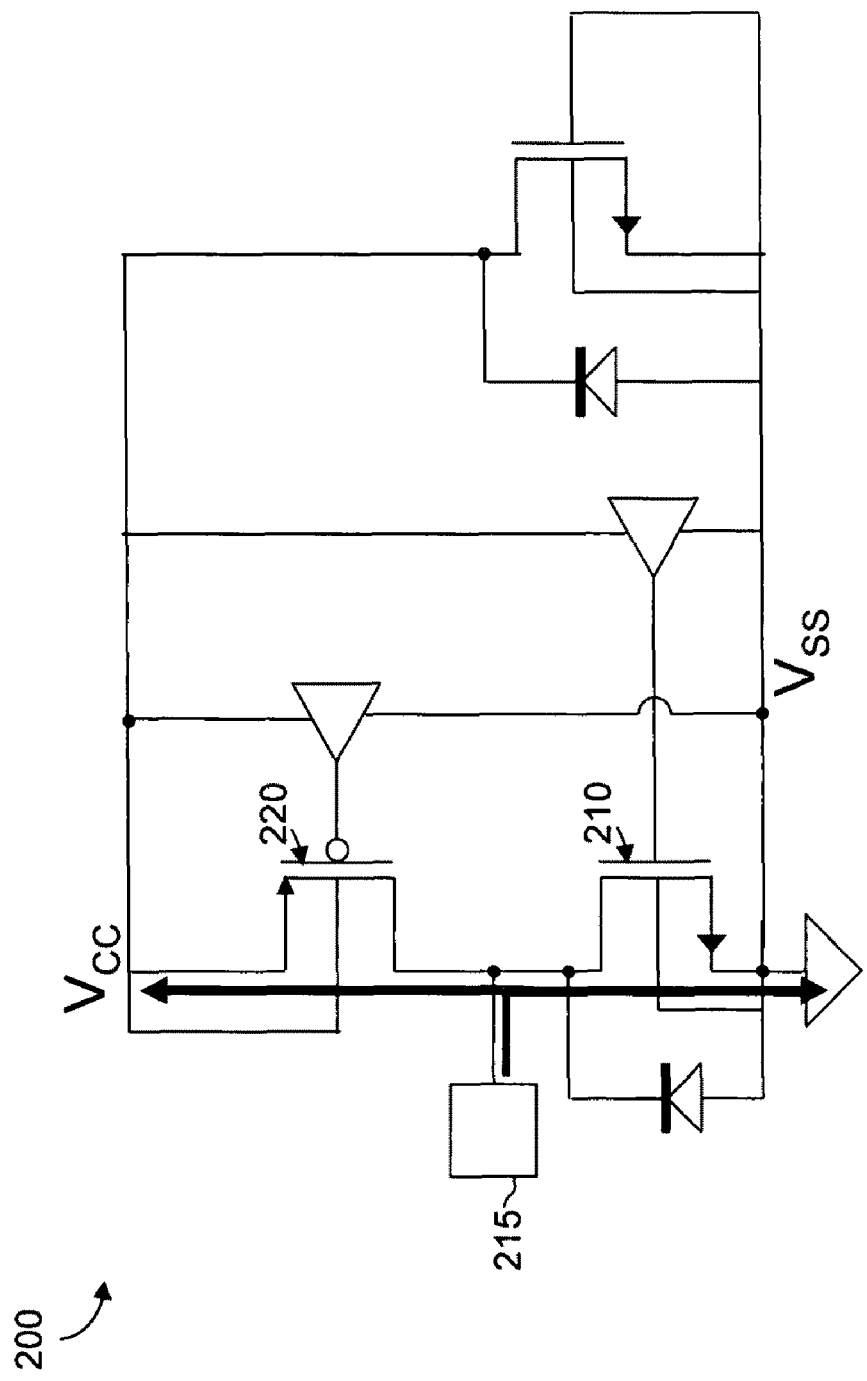
FIG. 2 illustrates an exemplary ESD protection circuit according to a first embodiment of the present invention.

FIG. 2 illustrates an exemplary ESD protection circuit according to a first embodiment of the present invention. The ESD protection circuit 200 may be used as part of an I/O buffer 200 on a target device. The ESD protection circuit includes an NMOS transistor 210 coupled to an I/O pad 215 and Vss. The ESD protection circuit also includes a PMOS transistor 220 coupled to the I/O pad 215 and Vcc. The ESD protection circuit may operate to provide a path to ground, Vss, to prevent a voltage spike on the pad from damaging circuitry on the target device.

Figure 3:
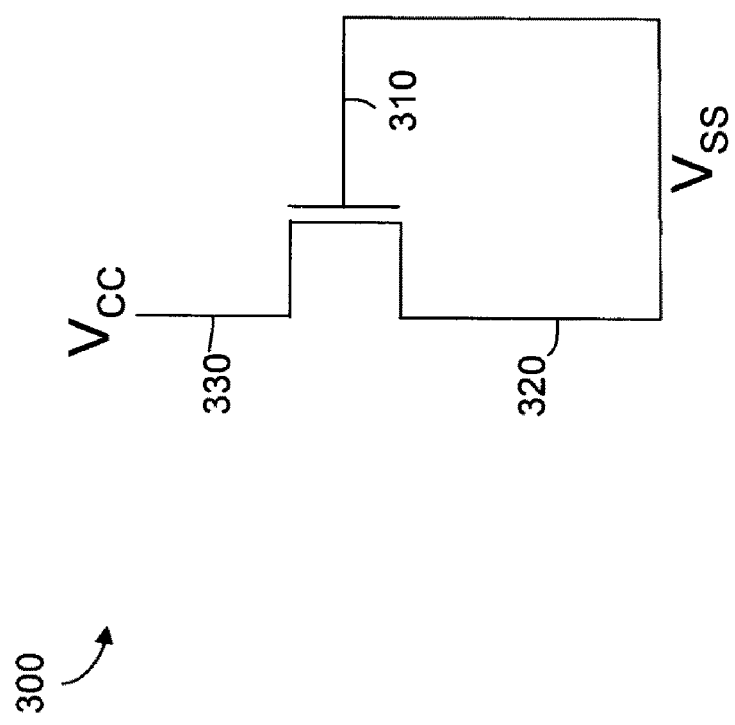
FIG. 3 illustrates an exemplary ESD protection circuit according to a second embodiment of the present invention.

FIG. 3 illustrates an exemplary ESD protection circuit 300 according to a second embodiment of the present invention. The ESD protection circuit 300 may be used as a power supply ESD clamp on a target device. The ESD protection circuit 300 includes a NMOS transistor having a gate 310, a source 320, and a drain 330. The gate 310 and source 320 are coupled together and connected to ground, Vss. The drain 330 is connected to a power supply voltage, Vcc. The ESD protection circuit 300 provides ESD protection by switching to a low-impedance "snapback" regime when a threshold voltage appears between Vcc and Vss which causes the drain junction to break down. It should be appreciated that although the exemplary ESD protection circuits may be illustrated to include a single NMOS and PMOS transistor that in actuality when implemented on a target device, each transistor may be implemented using a plurality of transistors connected in parallel.

Figure 4:
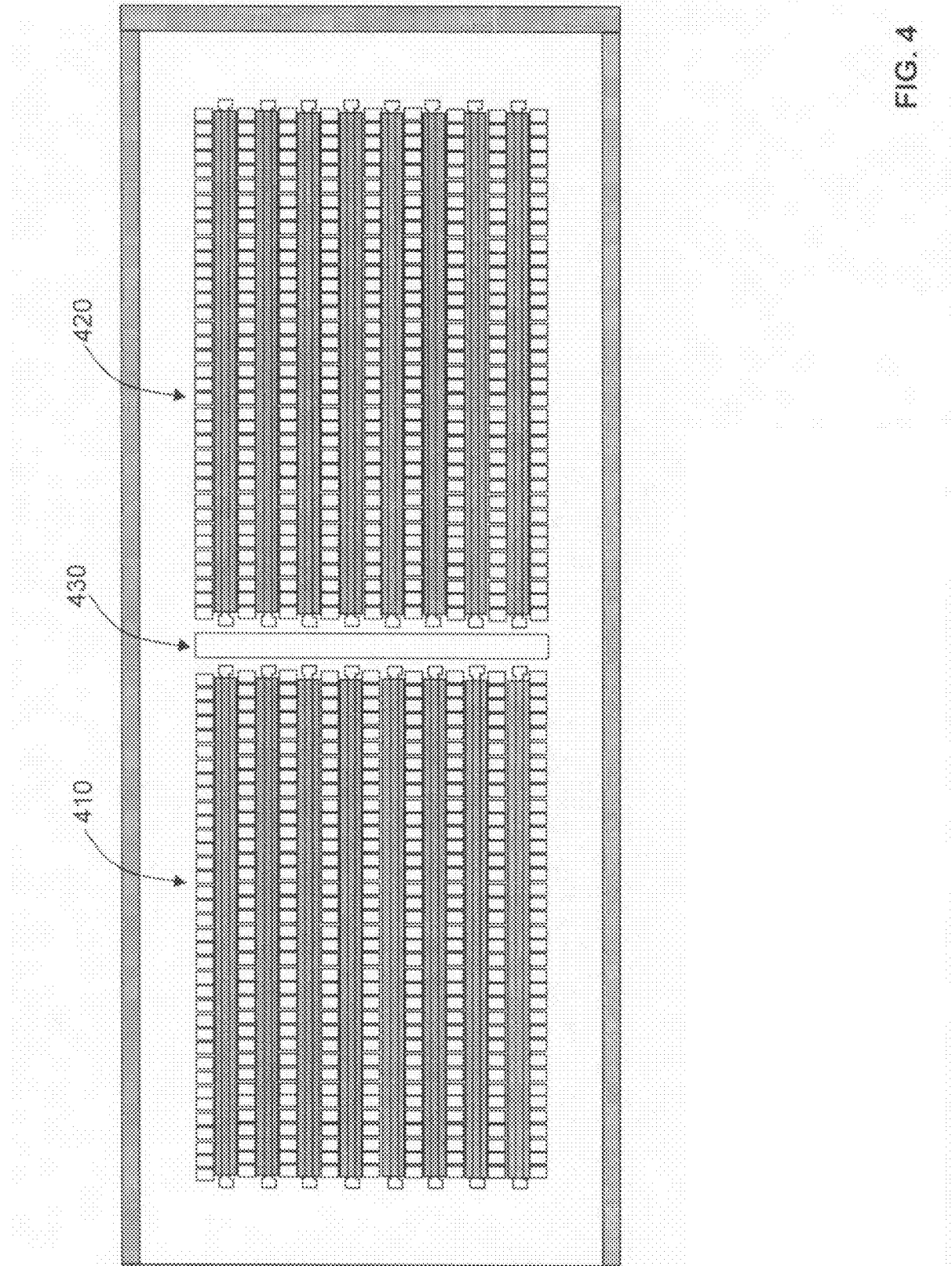
FIG. 4 illustrates an exemplary layout perspective of a plurality of transistors used to implement a portion of an ESD protection circuit according to embodiment of the present invention.

FIG. 4 illustrates an exemplary layout perspective of a plurality of transistors that may be used to implement a portion of an ESD protection circuit according to embodiment of the present invention. The transistors are arranged in a first array (block) 410 and a second array (block) 420. The first array of transistors 410 include a first plurality of transistors connected in parallel. The second array of transistors 420 include a second plurality of transistors connected in parallel. Transistors from the first array of transistors 410 and second array of transistors 420 may be used to implement a transistor in an ESD protection circuit. The arrangement of transistors as shown in FIG. 4 may be utilized when narrow pad pitch devices require the splitting of the overall width of an ESD clamp into two or more separate blocks of legs to fit in an allotted space on a target device.

An active region 430 is provided to improve triggering uniformity between the transistors in the first array 410 and the second array 420. The active region 430 between the two blocks of legs may be implanted with P type dopants, when the transistors are NMOS transistors, and subsequently salicided to effectively form a low resistance region in the area between the two arrays 410 and 420. The rectangular shaped active region 430 is not connected to any signal, but since it is doped with P type dopants and sits above a P-well it will substantially be at the P-well potential in the steady state. By lowering the resistance of an area between the first array of transistors 410 and the second array of transistors 420, the active region 430 reduces triggering non-uniformity between transistors in the first array 410 and the second array 420. Triggering non-uniformity may be induced by process or other geometric factors such as routing, proximity to pad, and/or other conditions that causes one of the two arrays to reach breakdown before the other during an ESD event. After breakdown occurs, the array of transistors triggered first lowers the voltage on the entire structure which prevents the other array of transistors from participating in voltage discharge. This has the effect of reducing the intended width of the ESD voltage clamp and reducing its effectiveness. Insufficient width of an ESD voltage clamp may lead to premature failure of the protection device due to excessive power dissipation density or failure due to voltage overshoot.

Figure 5:
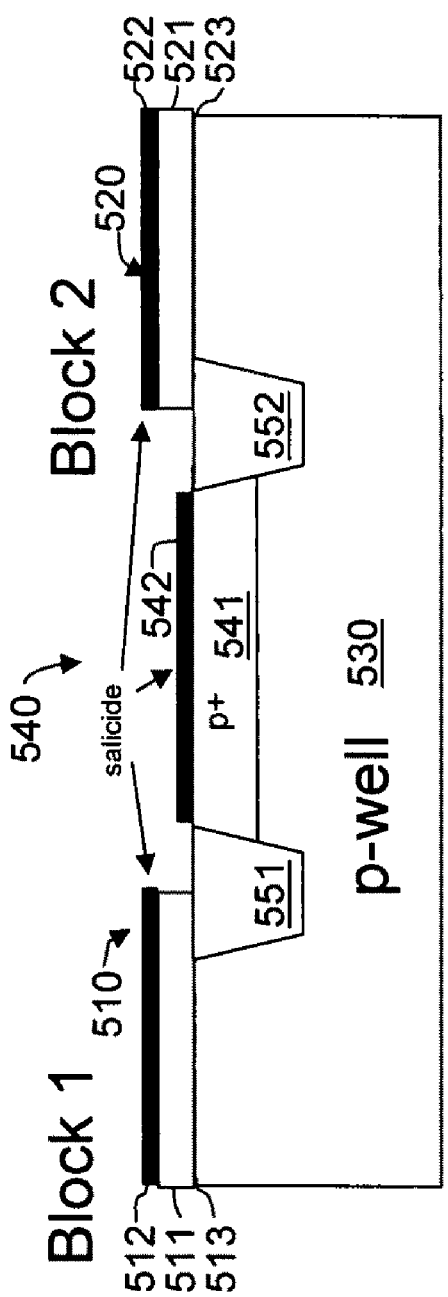
FIG. 5 illustrates a cross section perspective of NMOS transistors used to implement an exemplary ESD protection circuit according to an embodiment of the present invention.

FIG. 5 illustrates a cross section perspective of NMOS transistors used to implement an exemplary ESD protection circuit according to an embodiment of the present invention. FIG. 5 illustrates a cross section perspective of a first array (first block) of transistors 510 and a second array (second block) of transistors 520. Each array of transistors may include a plurality of transistors connected in parallel. The arrays of transistors may themselves also be connected in parallel. The exemplary transistors are NMOS transistors having source and drain doped with N type dopants. As shown, the arrays of transistors 510 and 520 include a layer of polysilicon 511 and 521 respectively, and a layer of salicide 512 and 522 respectively. The layers of polysilicon 511 and 521 are deposited over gate oxide 513 and 523 respectively, which is formed over a p-well 530.

A first shallow trench isolation region 551 is associated with the first array of transistors 510 and a second shallow trench isolation region 552 is associated with the second array of transistors 520. The first and second shallow trench isolation regions 551 and 552 reside on top of a p-well 530. The first and second shallow trench isolation regions 551 and 552 operate to prevent electrical current leakage between the arrays of transistors.

An active region 540 is situated between the first array of transistors 510 and the second array of transistors 520. According to an embodiment of the present invention, the active region 540 includes an area 541 above the p-well 530 and between the shallow trench regions 551 and 552 that is doped with P type dopants. The active region 540 also includes a layer of salicide 542. The active region 540 effectively lowers the resistance of the p-well which allows the transistors in the first array of transistors 510 to trigger more uniformly with the transistors in the second array of transistors 520.

The active region 540 formed between the first array of transistors 510 and the second array of transistors 520 effectively creates a low resistive region between the bodies underneath each array (p-well region 530). This will induce equal body potentials underneath each array during an ESD event and consequently will induce an equal amount of forward bias on the base emitter junction of the parasitic bipolar associated with each array. Uniformity of bipolar triggering is therefore enhanced.

Figure 6:
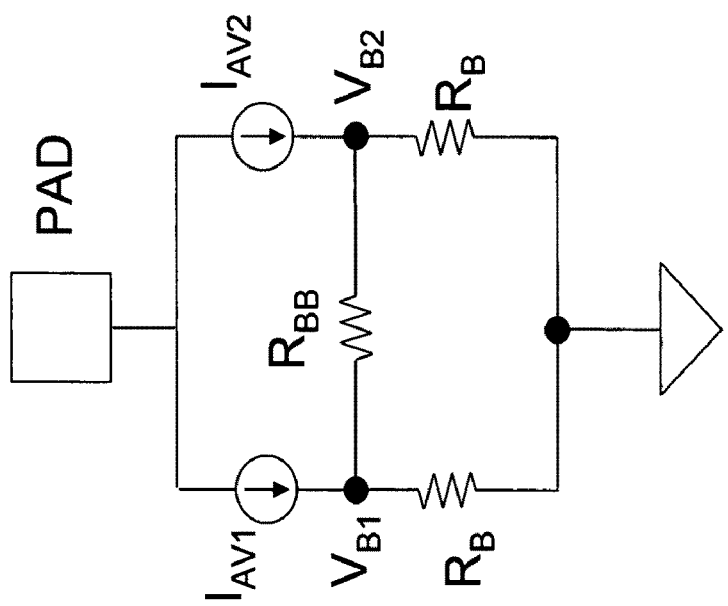
FIG. 6 illustrates an equivalent circuit resulting from the created low resistive active region according to an embodiment of the present invention.

FIG. 6 illustrates an equivalent circuit 600 resulting from the active region created between the first and second array of transistors according to an embodiment of the present invention. The active region 540 illustrated in FIG. 5 may be represented by resistor $R_{BB}$. An avalanching drain from a first array of transistors 510 illustrated in FIG. 5 may be represented by current source $I_{AV1}$. An avalanching drain from a second array of transistors 520 illustrated in FIG. 5 may be represented by current source $I_{AV2}$. The resistance seen from the body of each array of transistors to ground may be represented by $R_B$. When there is non-uniform triggering, $I_{AV1}$ will differ from $I_{AV2}$. Thus, the value of $R_{BB}$ should be minimized in order to equalize the values of $V_{B1}$ and $V_{B2}$.

Figure 7:
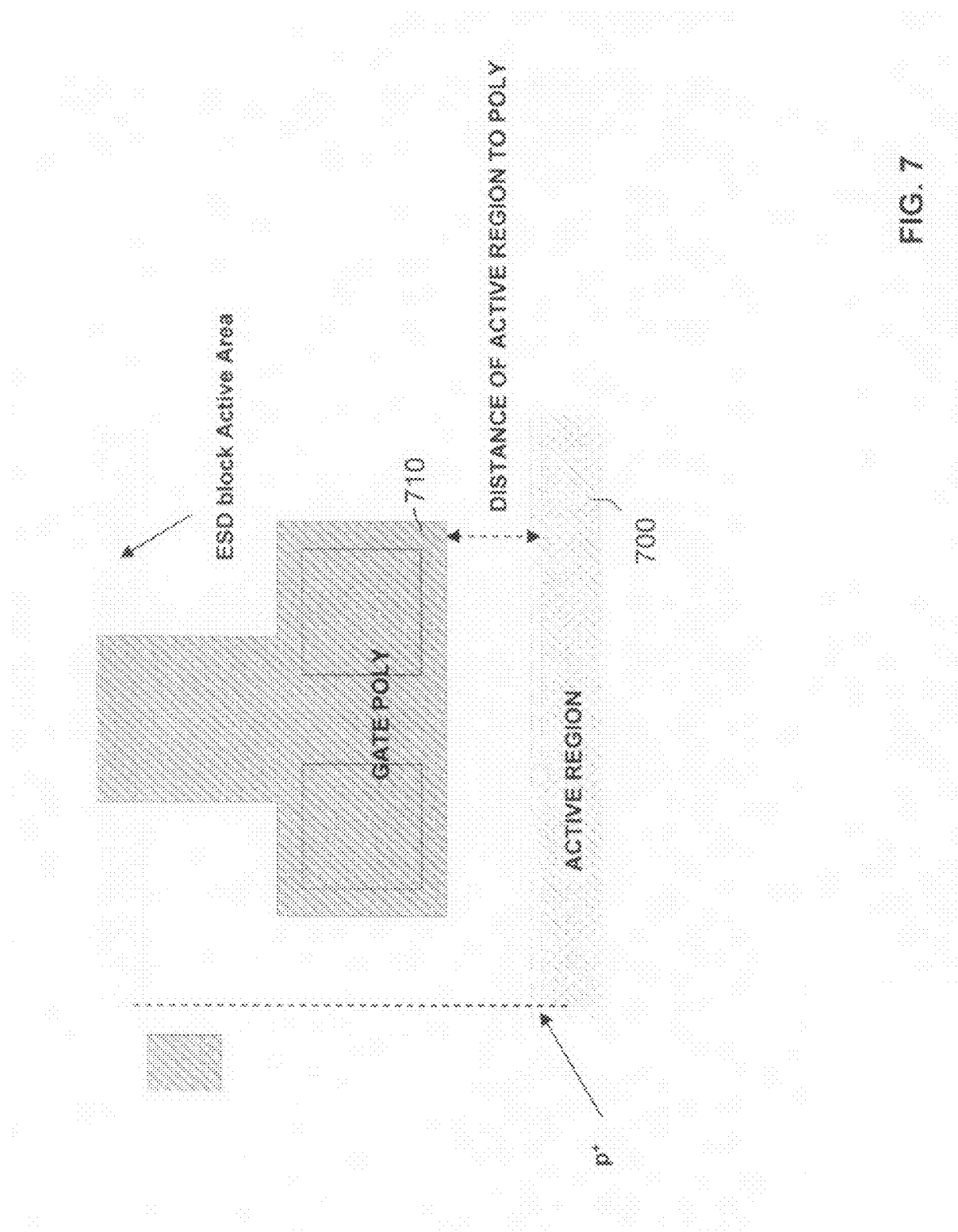
FIG. 7 illustrates a layout perspective of the active region according to an exemplary embodiment of the present invention.

FIG. 7 illustrates an alternate layout perspective of an active region 700 according to an exemplary embodiment of the present invention. The layout perspective of the active region 700 may be that of active region 540 shown in FIG. 5 or active region 430 shown in FIG. 4. In this embodiment, the active region 700 is situated close to the polysilicon gate (Gate Poly) 710. In a preferred embodiment, this distance is kept at a minimum allowed by the process technology. For example, with 65 nm technology the active region to polysilicon gate distance may range between 0.01 μm and 0.1 μm. The active region 700 should extend along the entire length of the array of transistors.

FIG. 8 is a flow chart illustrating a method for fabricating metal oxide semiconductor transistors according to an embodiment of the present invention. The method disclosed may improve trigger uniformity of a snapback ESD protection device. At 801, deep n-well implantation is performed.

Figure 9A:
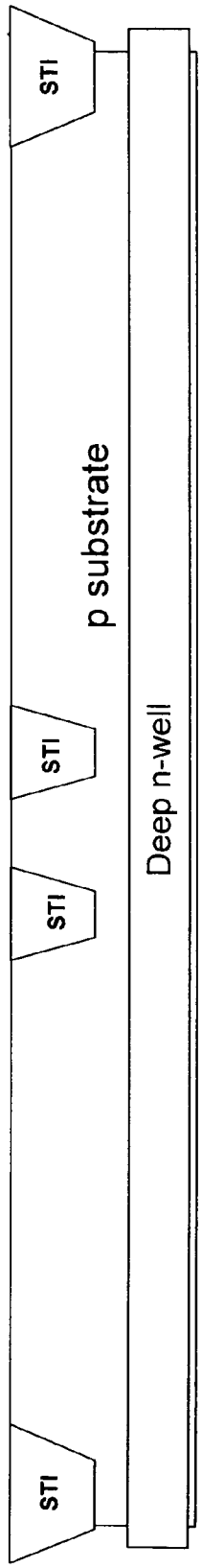

At 802, shallow trench isolation (STI) is formed. Shallow trench isolation is an integrated circuit feature which prevents electrical current leakage between adjacent semiconductor components. According to one embodiment, shallow trench isolation may be formed by applying a mask. A photolithography process may be used to cover areas on the silicon that are reserved for trenches with a photoresist material. It should be appreciated that either positive or negative photoresist may be used. The exposed areas of silicon are etched to form trenches. The mask is removed and the exposed area is filled with a dielectric, such as for example, silicon dioxide. Excess dielectric may be polished off. FIG. 9a illustrates procedures 801 and 802 being performed according to an embodiment of the present invention.

Figure 9B:
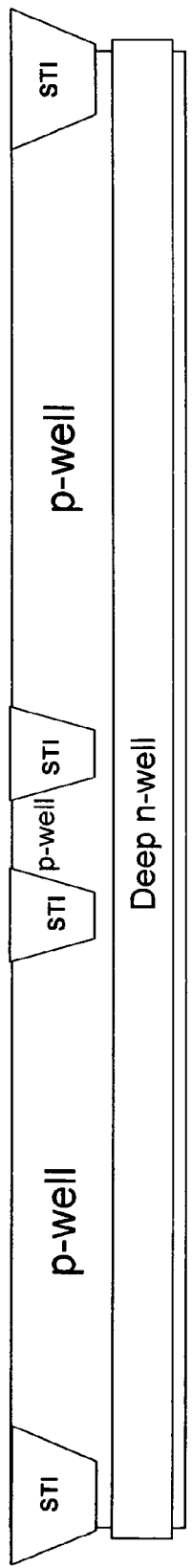

Referring back to FIG. 8, at 803, a p-well is implanted. According to an embodiment of the present invention, 2.5V p-well implantation is performed. FIG. 9b illustrates procedure 803 being performed according to an embodiment of the present invention.

Referring back to FIG. 8, at 804 gate oxide is formed above a portion of the p-well. According to an embodiment of the present invention, a 2.5V gate oxide formation is performed.

Figure 9C:
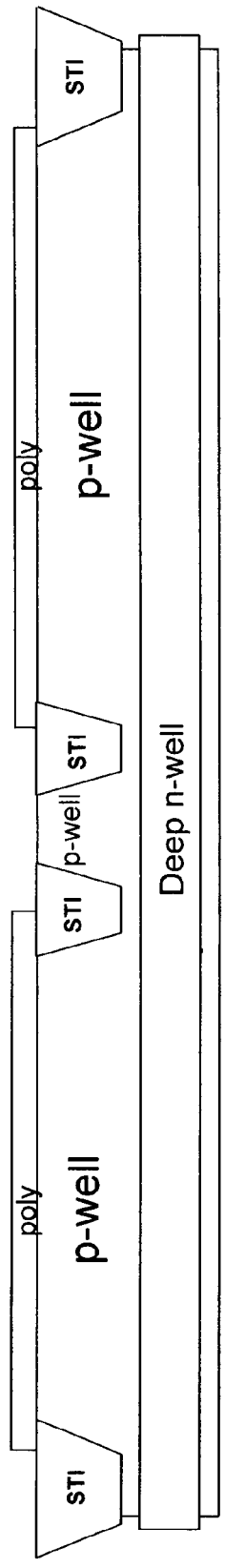

At 805 a layer of polysilicon (polycrystalline silicon) is deposited on top of the gate oxide. Polysilicon may be used as gate electrode material for the metal oxide semiconductor transistor. FIG. 9c illustrates procedures 804 and 805 being performed according to an embodiment of the present invention.

Referring back to FIG. 8, at 806, N/P lightly doped drain (LDD) implantation is performed. According to an embodiment of the present invention, a first mask is applied prior to N-LDD implantation and removed after N-LDD implantation. A second mask is applied prior to P-LDD implantation and removed after P-LDD implantation.

At 807, spacer definition is performed. According to an embodiment of the present invention, spacers are formed adjacent to the gate. FIG. 9d illustrates procedures 806 and 807 being performed according to an embodiment of the present invention.

Referring back to FIG. 8, at 808, N/P+ source drain (S/D) implantation is performed. Source drain implants dope the exposed silicon with a high concentration of impurities. The doping further penetrates exposed areas on the silicon surface further defining the n-type of p-type regions (source and drain junctions) deeper in the p-type or n-type substrate. According to an embodiment of the present invention, the dose may be 1E14 to 1E15 Ion/cm². The S/D implantation may be used to form a low resistive region between arrays of transistors. The p-well area defined by the shallow trench isolation regions between the two arrays of transistors may receive the S/D implants.

At 809, salicide formation is performed. According to an embodiment of the present invention, salicide is formed on exposed active areas in a self aligned manner. The salicide formation procedure may be used to form a layer of salicide on the active region between the arrays of transistors. FIG. 9e illustrates procedures 808 and 809 being performed according to an embodiment of the present invention.

FIG. 8 is a flow chart illustrating a method for fabricating metal oxide semiconductor transistors according to an embodiment of the present invention. The method may improve trigger uniformity of a snapback ESD protection device. Some of the procedures illustrated in this figure may be performed sequentially, in parallel or in an order other than that which is described. The techniques may be also be performed one or more times. It should be appreciated that not all of the techniques described are required to be performed, that additional techniques may be added, that some of the illustrated techniques may be substituted with other techniques, and other specifics may be utilized to practice the procedures described.

Embodiments of the present invention described provide an effective layout technique for addressing non-uniform triggering of transistors in ESD clamps that are laid out in parallel in multiple arrays. The active region that is added does not require additional space and thus does not incur any area penalty. The active region may be formed using regular layers and existing procedures available in conventional CMOS technology without requiring any additional time or resources.

In the foregoing specification embodiments of the invention has been described with reference to specific exemplary embodiments thereof. It will, however, be evident that various modifications and changes may be made thereto without departing from the broader spirit and scope of the embodiments of the invention. For example, the figures and description describe a method for creating an active region between two arrays of NMOS transistors where the active region is implanted with P type dopants. It should be appreciated that the procedure described may be modified and be applied similarly to two arrays of PMOS transistors where the active region is implanted with N type dopants. Although the techniques of the present invention are applied to two arrays of transistors, it should be appreciated that additional active regions may be generated when more than two arrays of transistors are connected in parallel to form more complex geometries. The specification and drawings are, accordingly, to be regarded in an illustrative rather than restrictive sense.

What is claimed is:

1. An electrostatic discharge (ESD) protection circuit, comprising:
    a first array of transistors, having source and drain doped with a first type of material, arranged in parallel in a first block;
    a second array of transistors, having source and drain doped with the first type of material, arranged in parallel in a second block; and
    an active region, between the first and second array of transistors and above a well doped with a second type of material, comprising a continuous doped layer with the second type of material that is complementary to the first type of material.

2. The ESD protection circuit of claim 1, wherein the active region is between a shallow trench isolation region of the first array of transistors and a shallow trench isolation region of the second array of transistors.

3. The ESD protection circuit of claim 1, wherein the active region effectively lowers the resistance of the well.

4. The ESD protection circuit of claim 1, wherein the active region between the first and second array of transistors includes a layer of salicide.

5. The ESD protection circuit of claim 1, wherein the first type of material comprises N type dopants and the second type of material comprises P type dopants.

6. The ESD protection circuit of claim 1, wherein the first type of material comprises P type dopants and the second type of material comprises N type dopants.

7. The ESD protection circuit of claim 1, wherein a distance between the active region and a polysilicon of the first and second array of transistors is between 0.01 μm and 0.1 μm.

8. A circuit, comprising:
    a first array of transistors, having source and drain doped with a first type of material, arranged in parallel in a first block;
    a second array of transistors, having source and drain doped with the first type of material, arranged in parallel in a second block; and
    an active region, between the first and second array of transistors, comprising a continuous doped layer of a second type of material that is complementary to the first type of material operable to provide low resistance to allow the transistors from the first array of transistors to trigger uniformly with transistors from the second array of transistors wherein the active region is above a well doped with the second type of material.

9. The circuit of claim 8, wherein the active region comprises a layer of salicide.

10. The circuit of claim 8, wherein the active region is between a shallow trench isolation region of the first array of transistors and a shallow trench isolation region of the second array of transistors.

11. The circuit of claim 8, wherein the first type of material comprises N type dopants and the second type of material comprises P type dopants.

12. The circuit of claim 8, wherein the first type of material comprises P type dopants and the second type of material comprises N type dopants.

13. The circuit of claim 8, wherein the active region effectively lowers a resistance of the well.

14. The circuit of claim 8, wherein a distance between the active region and a polysilicon of the first and second array of transistors is between 0.01 μm and 0.1 μm.

15. The circuit of claim 8, wherein the active region is between a shallow trench isolation region of the first array of transistors and a shallow trench isolation region of the second array of transistors, and above a well doped with the second type of material.

16. The circuit of claim 8, wherein the low resistance induces equal body potentials underneath the first array of transistors and the second array of transistors during an electrostatic discharge event.

17. The ESD protection circuit of claim 3, wherein the lower resistance of the well allows the first array of transistors to trigger uniformity with the second array of transistors.

18. The ESD protection circuit of claim 3, wherein the lower resistance of the well induces equal body potentials underneath the first array of transistors and the second array of transistors during an ESD event.

* * * * *